United States Patent [19]

Harrington

[11] 4,352,072
[45] Sep. 28, 1982

[54] FEEDFORWARD AMPLIFIER WITH ENHANCED STABILITY INTO LOADS WITH HIGH VSWR

[75] Inventor: Timothy A. Harrington, Cedar Rapids, Iowa

[73] Assignee: Rockwell International Corporation, El Segundo, Calif.

[21] Appl. No.: 182,534

[22] Filed: Aug. 29, 1980

[51] Int. Cl.³ .............................................. H03F 1/26
[52] U.S. Cl. ............................... 330/149; 330/124 R; 330/151
[58] Field of Search ................... 330/124 R, 149, 151

[56] References Cited

U.S. PATENT DOCUMENTS 3,471,798 10/1969 Seidel .............................. 330/151 X
3,886,470 5/1975 O'Neil et al. ................... 330/151 X

OTHER PUBLICATIONS

Hsieh et al., "A Feedforward S-Band MIC Amplifier System" *IEEE Journal of Solid-State Circuits*, vol. SC-11, No. 2, Apr. 1976, pp. 271-278.

Primary Examiner—James B. Mullins
Attorney, Agent, or Firm—Richard K. Robinson; Howard R. Greenberg; H. Fredrick Hamman

[57] ABSTRACT

A wide band, feedforward, power amplifier circuit has greater stability when quadrature hybrid devices are used to match the output impedance of the power amplifier with the load.

2 Claims, 2 Drawing Figures

FEEDFORWARD AMPLIFIER WITH ENHANCED STABILITY INTO LOADS WITH HIGH VSWR

BACKGROUND OF THE INVENTION

This invention relates to feedforward amplifier circuits.

Feedforward amplifier circuits are well known in the art, an example of which may be viewed by referring to FIG. 1, a schematic diagram of a prior art, wide-band, feedforward amplifier circuit. An input signal such as a radio frequency signal is applied to the feedforward amplifier circuit at terminal 1 which is connected to the directional coupler 3 at terminal A. In some embodiments, the signal that is present on the output terminal B of the directional coupler 3 is attenuated by the coupler by a selected amount such as 10 or 30 DB. Terminal A' is the remaining output terminal and the signal on Terminal A' is supplied to the power amplifier 5 which in the case of most feedforward circuits is a wide-band power amplifier. The directional coupler 3, due to its inherent capabilities, essentially samples the signal that is present on terminal A and provides a sample signal to the delay line 6 and the comparator 9. The comparator 9 compares the delayed sampled signal that is present on terminal D with an amplified representation of that signal that has been amplified by the amplifier 5 and sampled by the directional coupler 7 which is similar to the directional coupler 3 and obtains the difference of the signal that is on terminal E of the directional coupler 7 and the delayed signal that was delayed by the delay line 6 that is present on terminal D, the negative terminal of the comparator 9. The difference that is on the $\Delta$ terminal of the comparator 9 is amplified by the error amplifier 13 and applied to the terminal H of the directional coupler 15 which is used as a recombiner for recombining with the signal that is present on the terminal G the signal that is present on terminal H. The signal present on terminal G is the amplified signal that was amplified by amplifier 5, sampled by directional coupler 7 and delayed by delay 11. The recombined output signal is present on terminal I of the directional coupler 15 which is connected by way of terminal 2 to load 17.

The attenuation factors and delay characteristics of the directional couplers 3 and 7 and delay 6 are selected such that the amplitude and phase of the input signal components on the + and − terminals of the comparator 9 are equal, rendering only distortion components at the $\Delta$ terminal of comparator 9. Similarly, the attenuation factors and delay characteristics of the directional couplers 7 and 15 and delay 11 are selected to completely null the distortion components introduced by amplifier 5 and amplified by the error amplifier 13 so that the output signal at Terminal I does not have any distortion components, as a result of complication by the amplifier 5, present.

The mathematical derivation of the operation of the prior art circuit is provided in the Table of Equations by Equations 1 through 11. The voltage signals at the terminals are given the terminal letter as a subscript. The input signal that is applied to terminal 1 and terminal A is denoted $V_A$ and is mathematically represented in Equation 1. K is a constant and $\omega$ represents the radian frequency of the signal that is applied to terminal 1. The signal that is present on terminal B of the directional coupler 3 is represented by Equation 2. In the equation representing the amplified signal $V_C$, equation 3, $G_1$ is the gain of the amplifier 5, and has included therein the equivalent distortion voltage $D_{V_1}$ which represents the distortion components injected into the system by the power amplifier 5 and $T_1$ in the delay through amplifier 5. In this equation, $\alpha_1$ is the attenuation factor introduced to the circuit by the directional coupler 3. The delayed signal that is applied to the summing device 9 on the negative terminal D is represented by Equation 4 with $\alpha_3$ being the attenuation provided by the delay 6 and $T_2$ being the time delay provided by the delay 6. The sample of the amplified signal that is present on terminal E of the directional coupler 7 is provided by Equation 5 where $\alpha_2$ is the attenuation factor of the directional coupler 7. The signal that is applied to the error amplifier 13 is represented by Equation 6 with $\alpha_5$ being the attenuation of the comparator 9. The expansion of Equation 6 is provided in Equation 7.

The recombination of the signals, as mentioned earlier, is provided by the directional coupler 15. Equation 8 is the mathematical representation of the signal that is present on terminal G where an additional time delay $T_3$ and attenuation $\alpha_4$ is provided as a result of signal propogation through the delay 11.

The output of the error amplifier is represented by Equation 9 which is the difference between Equations 4 and 5 amplified by the error amplifier 13 with the $G_2$ being the gain of amplifier 13 and $T_4$ being the propogation delay of the signal by amplifier 13, and $D_{V_2}$ being the distortion components generated by amplifier 13. The mathematical recombination of the signal is provided by Equation 10 with $V_I$ being the signal that is present on terminal I of the directional coupler 15 and $\alpha_6$ is the attenuation factor injected on the signal by the directional coupler 15. Equation 11 is the expansion of Equation 10.

The selection of the directional couplers and delay lines, as was discussed above, are such that $T_3 = T_4$ and $\sqrt{\alpha_4} = \sqrt{\alpha_2 \alpha_5}\, G_2$, then equation 11 may be simplified so that the distortion from amplifier 5, $D_{V_1}$ is cancelled and equation 12 represents the output signal at Terminal I.

It should be noted that the distortion component from the error amplifier $D_{V_2}$ is considerably less than the distortion level of power amplifier 5. In the situation where $D_{V_2}$ is beyond acceptable limits then prior art circuits are known in which feedforwarding techniques are used to reduce the $D_{V_2}$ component.

SUMMARY OF THE INVENTION

The prior art circuit has as a disadvantage the capabilities of causing the error amplifier 13 of FIG. 1 to oscillate when there is an impedance mismatch between the load 17 and the desired load impedance of the amplifier 5. When there is an impedance mismatch between the power amplifier 5 and the load 17, there are electromagnetic waves reflected back from the load to the power amplifier 5. In general, due to the lack of a conjugate match at the output part of a power amplifier, the reflected electro-magnetic waves are reradiated and propagate through the directional coupler 7 and cause an error to be introduced into the recombined signal at terminal 2 by the action of the comparator 9 and the error amplifier 13. This error is cumulative and can cause the error amplifier 13 to become unstable. The feedback path that facilitates the unstable condition for amplifier 13, under mismatched conditions, includes the directional coupler 15, the delay 11, the directional coupler 7 and the comparator 9.

A wide band, feedforward, power amplifier circuit has greater stability when it presents a matched source impedance to the load network. This can facilitated by using quadrature hybrid devices to match the output impedance of the power amplifier with the load.

The power amplifier of the circuit has two amplifying devices and the input signal is applied to a quadrature hybrid device which performs a Hilbert transform on the input signal and applies the in-phase signal to a first amplifier and a quadrature-phase signal to a second amplifier. The output of the first amplifier is applied to a second Hilbert's transform device where the signal is shifted in phase by 90° and the output of the second amplifier is combined with the shifted signal to obtain a recombination of the input signal. The Hilbert transform device or quadrature hybrid device has incorporated therein the advantage of being matched in impedance with the load.

Many advantages of the present invention may be ascertained from a reading of the specification and the claims in conjunction with the drawings.

DETAILED DESCRIPTION OF THE PREFERRED EMBODIMENT

Figure 1:
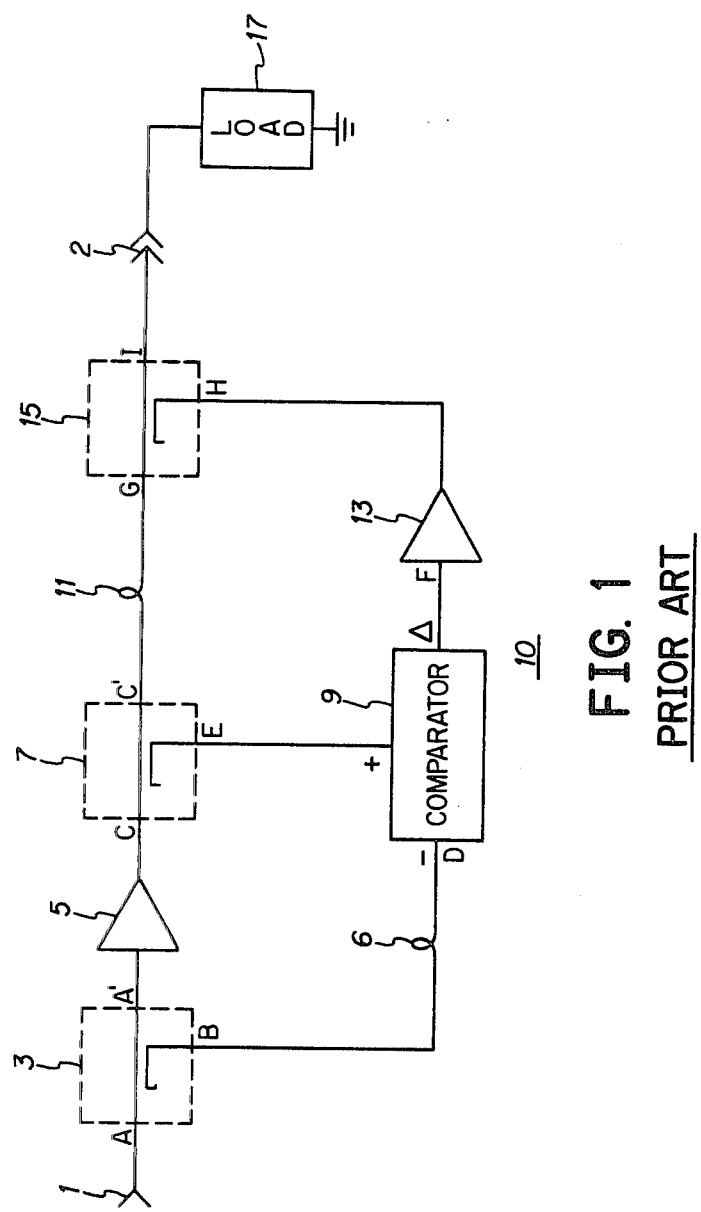
FIG. 1 is a simplified schematic diagram of the prior art feedforward wide band amplifier.
Figure 2:
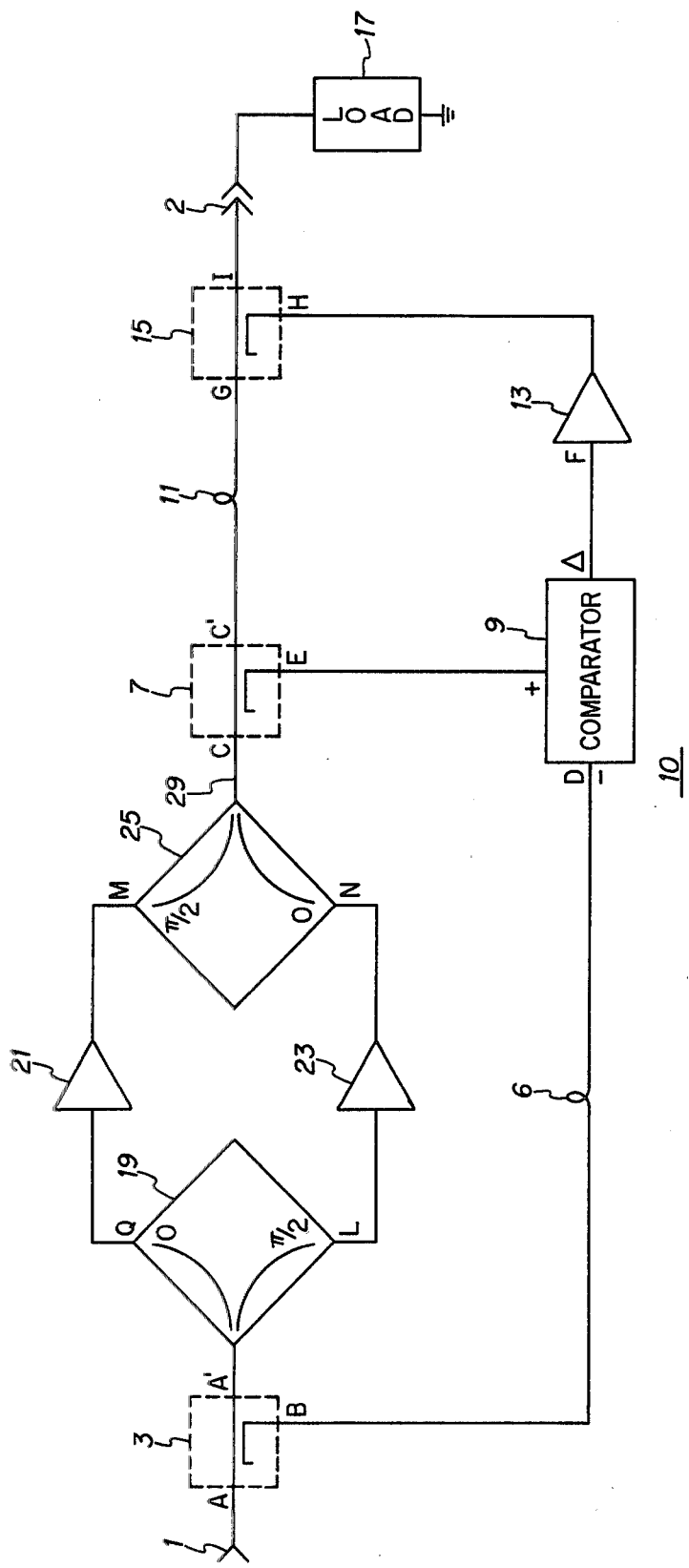
FIG. 2 is a simplified diagram of the wide-band feedforward power amplifier according to the invention.

The output impedance of a power amplifier is never conjugate matched with its load network as this would require as much power dissipation in the amplifier as the load. For this reason, power amplifiers are designed for values of load impedance which improve upon the amplifier's ability to output power without increased amplifier dissipation, i.e., to increase or maximize the amplifier's efficiency. Since, in general, this process will not produce a conjugate match at the amplifier's output port, the mismatch between the output impedance of the power amplifier and the load can cause reflected waves to propagate from the load to the power amplifier which, because of its unmatched source impedance, would reradiate the reflected waves and thereby create a condition which could result in the circuitry being unstable if feedforward error correction is being used. In FIG. 2, to which reference should now be made, there is shown a feedforward power amplifier circuit that has included therein a means for providing a matched source impedance from the power amplifier that can be selected to match the impedance of the load that the circuitry is being interfaced to. The input signal is applied to terminal A of the directional coupler 3. The output signals from the directional couplers are present on terminal B and A'. The A' output from the directional coupler is applied to a Hilbert's transform device 19 which, in the preferred embodiment, is a quadrature hybrid device that has two output signals, the first being the signal that is present on terminal K and the second, the signal that is present on terminal L which is equal amplitude and is in quadrature phase relationship with the signal on terminal K. The signal on terminal K is amplified by amplifier 21 and applied to a second Hilbert's transform device 25 at terminal M. The quadrature signal that is present on terminal L of the quadrature hybrid device 19 is applied to the amplifier 23 for amplification. The amplified quadrature signal is then applied to terminal N of the quadrature device 25. The quadrature hybrid device 25 combines the signal that is present on terminal M with the signal that is present on terminal N to obtain the recombined amplified signal that is present on conductor 29 at terminal C of the directional coupler 7. The ratio of the signal at terminal A' of the directional coupler 3 to the signal of terminal C of the directional coupler 17 should, after compensation for the propogation delays, equal a constant.

The operation of the feedforward circuitry provides for the directional coupler 3 to sample the input signal and apply it to a comparator 9 for summing with a sample signal of the output of the power amplifier circuitry which is the signal that is present at terminal C of the directional coupler 7. The sampled output from the directional coupler 3 is applied to, after passing through the delay 6, terminal D of the comparator 9 for summing with the sampled signal on terminal E of the directional coupler 7. The difference between the two signals is present at the Δ terminal of the comparator 9 and is applied to terminal F of the error amplifier 13. The amplified error signal is combined with the power amplified signal at the directional coupler 15 with the amplified error signal being present at terminal H and the power amplified signal after being passed through the delay 11 is present on terminal G of the directional coupler 15. The signal at terminal I is the amplified signal with any distortion caused by power amplifiers $\alpha_{21}$ and $\alpha_{23}$ essentially removed and is applied to the load 17 by way of the terminal 2.

Theory of Operations

The input signal that is present on terminal 1 and also terminal A of the directional coupler is represented by Equation 1 of the Table of Equations. The sampled signal at terminal B is in a similar fashion represented by Equation 2 of the Table of Equations. Equation 13 is the signal that is present at the Q terminal of the hybrid device 19. Equation 14 represents the signal that is present on terminal L that has a quadrature relationship with the signal that is present on terminal Q. Equation 15 is the mathematical representation of the signal that is present on terminal M and includes the amplifier gain factors G as well as the amplifier line delay $T_2$. Likewise, Equation 16 represents the signal that is present on terminal N. Equation 17 is the signal that is present on terminal C of the directional coupler 7 without $T_3$ being the delay time provided by the quadrature hybrid 25. Equations 18 and 29 are further simplifications of voltage $V_C$. Note that the input power is split into two quadrature signals, however, the output combiner (quadrature hybrid 25) combines these two signals into one coherent signal with no loss due to power splitting or combining. Power combining using this technique also yields a matched source impedance from the main amplifier output port (devices 19, 21, 23, 25) as long as amplifiers 21 and 23 are identical. It is this latter property which is central to eliminating the subject instability problem.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

| TABLE OF EQUATIONS |
| --- |
| 1. $V_A = K \sin \omega t$ |

TABLE OF EQUATIONS -continued

2. $V_B = K \sqrt{\alpha_1} \sin \omega t$

3. $V_C = K \sqrt{G_1} \sin \omega(t - T_1) + DV_1(t)$

4. $V_D = K \sqrt{\alpha_1 \alpha_3} \sin \omega(t - T_2)$

5. $V_E = K \sqrt{\alpha_2 G_1} \sin \omega(t - T_1) + \sqrt{\alpha_2} \cdot DV_1(t)$ 6. $V_F = \sqrt{\alpha_5} (V_E - V_D)$ 7. $V_F = K \sqrt{\alpha_2 \alpha_5 G_1} \sin \omega(t - T_1) + \sqrt{\alpha_5 \alpha_2} DV_1(t) - K \sqrt{\alpha_1 \alpha_3 \alpha_5} \sin \omega(t - T_2)$ 8. $V_G = K \sqrt{\alpha_4 G_1} \sin \omega(t - T_1 - T_3) + \sqrt{\alpha_4} \cdot DV_1(t - T_3)$ 9. $V_H = K \sqrt{\alpha_2 \alpha_5 G_1 G_2} \sin \omega(t - T_1 - T_4) + DV_1(t - T_4) \sqrt{\alpha_5 \alpha_2 G_2} - K \sqrt{\alpha_1 \alpha_3 \alpha_5 G_2} \sin \omega(t - T_2 - T_4) + DV_2(t)$ 10. $V_I = \sqrt{\alpha_6} \cdot (V_G - V_H)$ 11. $V_I = K \sqrt{G_1 \alpha_4 \alpha_6} \sin \omega(t - T_1 - T_3) + \sqrt{\alpha_4 \alpha_6} DV_1(t - T_3) - K \sqrt{\alpha_2 \alpha_5 \alpha_6 G_1 G_2} \sin \omega(t - T_1 - T_4) - \sqrt{\alpha_2 \alpha_5 \alpha_6 G_2} DV_1(t - T_4) + K \sqrt{\alpha_1 \alpha_3 \alpha_5 \alpha_6 G_2} \sin \omega(t - T_2 - T_4) - \sqrt{\alpha_6} \cdot DV_2(t)$ 12. $V_I = K \sqrt{\alpha_1 \alpha_3 \alpha_5 \alpha_6 G_2} \sin \omega(t - T_2 - T_4) - \sqrt{\alpha_6} \cdot DV_2(t)$ 13. $V_K = \frac{K}{\sqrt{2}} \sin (\omega t - T_1)$ 14. $V_L = \frac{K}{\sqrt{2}} \sin \left( (\omega t - T_1) - \frac{\pi}{2} \right)$ 15. $V_M = \frac{G}{\sqrt{2}} \frac{K}{\sqrt{2}} \sin (\omega t - T_1 - T_2)$ 16. $V_N = \frac{G}{\sqrt{2}} \frac{K}{\sqrt{2}} \sin \left( (\omega t - T_1 - T_2) - \frac{\pi}{2} \right)$ 17. $V_C = V_\phi{}^1$ shifted ½ rads + $V_\phi{}^1 = V_C =$ $\frac{GK}{2} \sin \left( \left( \omega t - T_1 - T_2 - T_3 - \frac{\pi}{2} \right) + \frac{GK}{2} \sin (\omega t - T_1 - T_2 - T_3) - \frac{\pi}{2} \right)$ 18. $V_C = GK \sin \left( (\omega t - T_1 - T_2 - T_3) - \frac{\pi}{2} \right)$ 19. $V_C = GK \cos ((\omega t - T_1 - T_2 - T_3))$

I claim:

1. A feedforward amplifier for amplifying an electromagnetic wave signal for driving an output load impedance, comprising:
   first signal path including, in cascade arrangement, signal amplifier means for amplifying the electromagnetic wave signal, and a first delay network;
   second signal path, including in cascade arrangement, a second delay network, summing means, and an error amplifier means;
   coupler means for dividing the signal into a first signal component and a second signal component and for coupling the first signal component to the first signal path and the second signal component to the second signal path;
   second coupler means for sampling the output of the signal amplifier and coupling the sampled signal to the input of the summing means;
   recombiner means for recombining the signal from the first signal path with the signal from the second signal path to obtain an amplified electromagnetic wave signal and
   the signal amplifier means includes;
   a first Hilbert's transformer means for obtaining a quadrature-phase electromagnetic wave signal and an in-phase electromagnetic wave signal, first amplifier means for amplifying the in-phase electromagnetic wave signal, second amplifier means for amplifying the quadrature-phase electromagnetic wave signal, and second Hilbert's transformer means for recombining the amplified in-phase electromagnetic wave signal with the quadrature-phase electromagnetic wave signal after first performing a Hilbert's transform on the amplified in-phase electromagnetic wave signal.

2. A method of amplifying electromagnetic wave signals comprising:
   performing a Hilbert's transform on an electromagnetic wave signal to obtain an in-phase component signal and a quadrature-phase component signal;
   amplifying the in-phase component signal;
   amplifying the quadrature-phase component signal;
   performing a Hilbert's transform on the amplified in-phase signal to obtain a second amplified signal;
   combining the first amplified quadrature-phase component signal with the second amplified signal to obtain an amplified electromagnetic wave signal;
   sampling the amplified electromagnetic wave signal;
   delaying the propagation of the electromagnetic signal by predetermined time delay;
   obtaining the difference between the sampled amplified electromagnetic wave signal and the delayed electromagnetic wave signal;
   amplifying the difference;
   delaying the amplified electromagnetic wave signal; and
   recombining the amplified electromagnetic wave signal with the amplified difference.

* * * * *